United States Patent
Yang et al.

(10) Patent No.: US 9,064,604 B2
(45) Date of Patent: Jun. 23, 2015

(54) TIMING LOGIC FOR MEMORY ARRAY

(71) Applicant: Taiwan Semiconductor Manufacturing Company Limited, Hsin-Chu (TW)

(72) Inventors: Harn-Bor Yang, Hsinchu (TW); Chia-Cheng Chen, Toufen Township (TW); Ching-Wei Wu, Caotun Town (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/893,006

(22) Filed: May 13, 2013

(65) Prior Publication Data

US 2014/0269021 A1 Sep. 18, 2014

Related U.S. Application Data

(60) Provisional application No. 61/794,347, filed on Mar. 15, 2013.

(51) Int. Cl.
*G11C 11/419* (2006.01)
*G11C 29/50* (2006.01)
*G11C 11/41* (2006.01)

(52) U.S. Cl.
CPC .............. *G11C 11/419* (2013.01); *G11C 11/41* (2013.01); *G11C 29/50012* (2013.01)

(58) Field of Classification Search
CPC .............. G11C 11/405; G11C 11/406; G11C 11/4076; G06F 15/76; G06F 15/7867; G06F 15/8023

See application file for complete search history.

(56) References Cited

U.S. PATENT DOCUMENTS

| | | | | |
|---|---|---|---|---|
| 6,882,562 B2 * | 4/2005 | Beucler | ........................ | 365/154 |
| 6,917,536 B1 * | 7/2005 | McLaury et al. | ............. | 365/154 |
| 6,967,861 B2 * | 11/2005 | Braceras et al. | ............. | 365/154 |
| 7,355,907 B2 * | 4/2008 | Chen et al. | ..................... | 365/191 |
| 8,547,723 B2 * | 10/2013 | Tanaka et al. | ................... | 365/72 |
| 8,705,310 B2 * | 4/2014 | Tran et al. | ................ | 365/230.03 |
| 2003/0047759 A1 * | 3/2003 | Reiner et al. | .................. | 257/204 |
| 2012/0012896 A1 * | 1/2012 | Venkatraman et al. | ........ | 257/206 |

* cited by examiner

*Primary Examiner* — Huan Hoang
*Assistant Examiner* — Tri Hoang
(74) *Attorney, Agent, or Firm* — Cooper Legal Group, LLC

(57) ABSTRACT

Among other things, techniques and systems are provided for devising a schedule for performing read/write operations on a memory cell. A control signal is provided to timing logic. Using one or more properties of the control signal, such as a voltage property, the timing logic is configured to adjust a time window during which at least one of a read operation or a write operation is performed within a cycle. In this way, the timing logic affects a dynamic switch between an early-read operation, a late-read operation, an early-write operation, a late-write operation, a read-then-write operation, and a write-then-read operation between cycles. In some embodiments, the memory cell for which the schedule is devised is an SRAM cell, such as a six-transistor SRAM cell.

20 Claims, 12 Drawing Sheets

TIMING LOGIC FOR MEMORY ARRAY

BACKGROUND

Read/write operations performed on some types of memory cells, such as static random access memory (SRAM) are controlled by control logic. Generally, the control logic is designed to perform read/write operations in a particular sequence, which cannot later be varied. For example, control logic designed to perform read operations before write operations cannot be dynamically altered to provide for performing write operations before read operations.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Systems and techniques for manipulating when a read operation or a write operation is performed during a cycle are provided. Control logic of a memory arrangement is configured to receive a control signal. The control signal is utilized by the control logic to determine when, within a cycle, a requested read operation or a requested write operation is to be performed. As an example, the control logic is configured to initiate a read operation early in a cycle when a first voltage is applied to the control logic via the control signal. In another example, the control logic is configured to initiate a read operation later in the cycle when a second voltage is applied to the control logic via the control signal.

In some embodiments, the control signal is further utilized by the control logic to determine an order for performing a read operation and a write operation within a same cycle. By way of example, the logic circuit is configured to perform a read operation prior to a write operation when a first voltage is applied to the control logic via the control signal and is configured to perform a write operation prior to the read operation when a second voltage is applied to the control logic via the control signal. In this way, the control logic provides for dynamically altering an order of operations on a cycle-by-cycle basis, for example.

According to some embodiments, the control logic is part of an SRAM memory arrangement. As an example, the control logic is configured to determine a schedule for read operations or write operations to a six-transistor (6T) SRAM cell.

The following description and annexed drawings set forth certain illustrative aspects and implementations. These are indicative of but a few of the various ways in which one or more aspects are employed. Other aspects, advantages, and novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and structures of the drawings are not necessarily be drawn to scale. Accordingly, the dimensions of the various features is arbitrarily increased or reduced for clarity of discussion.

DETAILED DESCRIPTION

Figure 1:
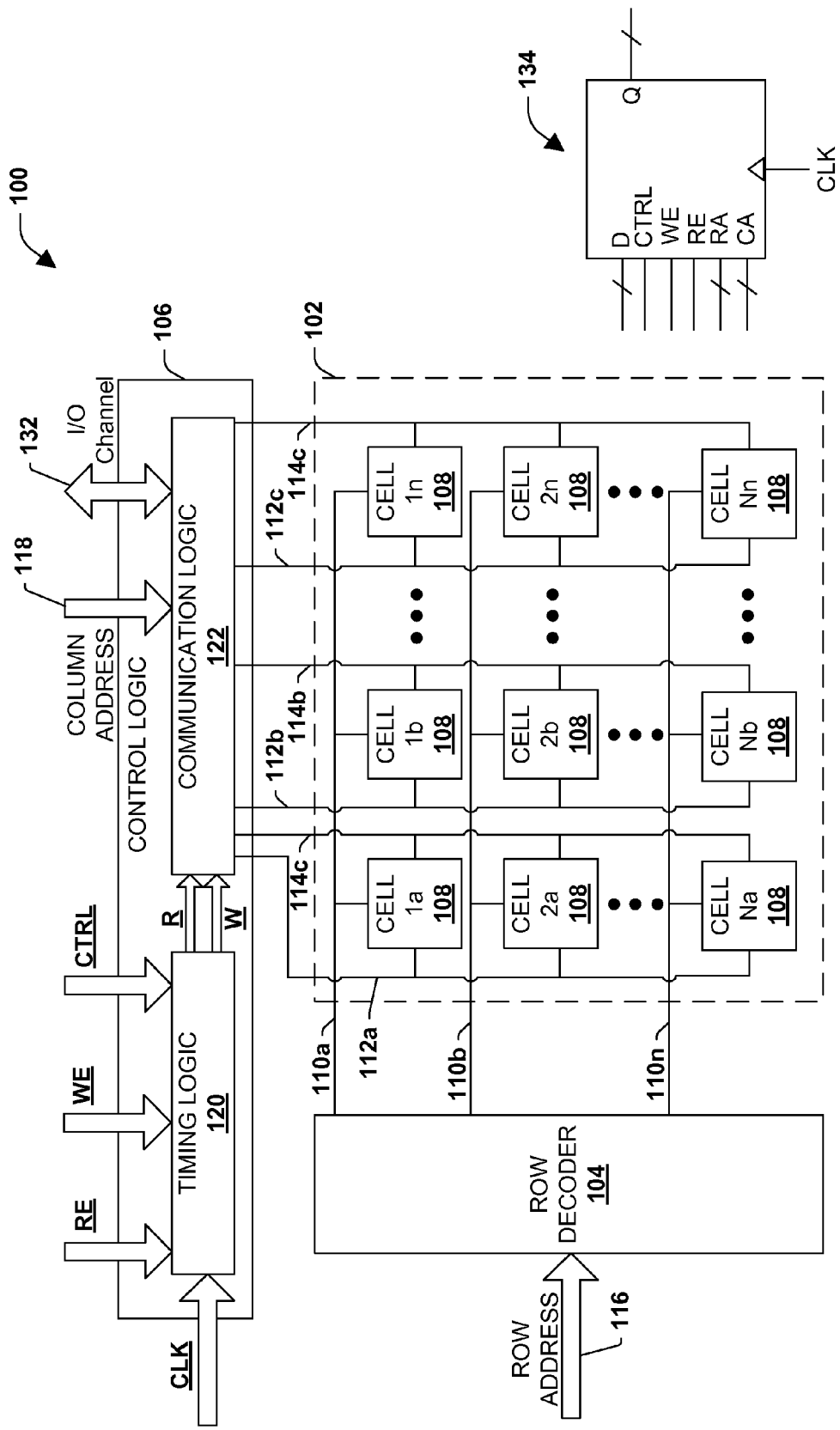
FIG. 1a is a component block diagram illustrating a memory arrangement, according to some embodiments.
FIG. 1b is a symbol for describing a memory arrangement according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

As used herein, a read/write operation refers to an operation performed on a memory cell during a cycle. In some embodiments, a read/write operation comprises performing a read operation on the memory cell during a cycle. In some embodiments, a read/write operation comprises performing a write operation on the memory cell during a cycle. In some embodiments, a read/write operation comprises performing both a read operation and a write operation on the memory cell during a cycle.

Referring to FIG. 1a, a component block diagram of an example memory arrangement 100 is illustrated. The memory arrangement 100 comprises a memory array 102, a row decoder 104, and control logic 106. In some embodiments, the memory arrangement 100 is a static random access memory (SRAM) arrangement. In some embodiments, the memory arrangement 100 is a double pump two port register file which is configured to selectively perform a single port function, such as an early-read operation or an early-write operation. In some embodiments, the memory arrangement 100 is a double pump two port register file configured to perform dual port functions, such as read-then-write or write-then-read. In still some embodiments, the memory arrangement 100 is configured to perform other functions.

The memory array 102 comprises a plurality of memory cells 108, such as SRAM cells, typically arranged in a grid pattern. The grid pattern comprises rows, extending horizontally on the page, and columns, extending vertically on the page. A row of memory cells 108 is identified by a like number. For example, memory cells 108 of a first row are labeled with the number "1," memory cells 108 of a second row are labeled with the number "2," etc. The number of rows is equal to "N," where "N" is a positive integer greater than or equal to one. A column of memory cells 108 is identified by a like alphabetical letter. For example, memory cells 108 of a first column are labeled with the letter "a," memory cells 108 of a second column are labeled with the letter "b," etc. The number of columns is equal to "n," where "n" is a positive integer greater than or equal to one.

Read/write operations are performed on respective memory cells 108 using wordlines 110, where wordlines 110a, 110b, and 110n are shown for illustration, and bitlines 112, 114, where bitlines 112a, 112b, 112c, 114a, 114b, and 114c are shown for illustration. Electrical signals, or address signals, transmitted through a wordline 110 are typically configured to control access to a memory cell 108. For example, when a first voltage is applied to a memory cell 108 via a wordline 110, the control logic 106 is granted access to the memory cell 108 to perform a read/write operation. When a second voltage is applied to the memory cell 108 via the wordline 110, the control logic 106 is denied access to the memory cell 108 to inhibit the control logic 106 from preforming a read/write operation.

In some embodiments, respective wordlines 110 are coupled to a plurality of memory cells 108, such as a row of memory cells 108. In this way, access to a plurality of memory cells 108 is controlled via a single electrical signal. By way of example, electrical signals transmitted through a first wordline 110a control access to a first row of memory cells 108, and electrical signals transmitted through a second wordline 110b control access to a second row of memory cells, etc.

Content is written to and read from respective memory cells using one or more pairs of bitlines 112, 114, which are connected to the control logic 106. Data transmitted through the second bitline 114 is generally a logical complement to data transmitted through a first bitline 112 of the pair. For example, if a voltage corresponding to "1" is transmitted through the first bitline 112a, a voltage corresponding to "0" is transmitted through the second bitline 114a of the pair.

In some embodiments, respective pairs of bitlines 112, 114 are coupled to a plurality of memory cells 108, such as a column of memory cells 108. In this way, content is written to or read from a plurality of memory cells 108 by the control logic 106 via a single pair of bitlines 112, 114. By way of example, content is written to or read from the memory cells 108 of the first column using a first pair of bitlines 112a, 114a.

In some embodiments, the row decoder 104 is configured to utilize the wordlines 110 to inhibit access by the control logic 106 to more than one row at a time. In this way, the control logic 106 is inhibited from writing content to and/or reading content from more than one memory cell 108 of a column at a time, for example.

When it is desired to perform a read/write operation on a memory cell 108, a row address 116 for the memory cell 108 is transmitted to the row decoder 104 and a column address 118 for the memory cell 108 is transmitted to the control logic 106. The row address corresponds to a row of the memory array 102 where the memory cell 108 is located. The column address corresponds to a column of the memory array 102 where the memory cell 108 is located.

The row decoder 104 is configured to decode the row address and provide an address signal to the corresponding row via a wordline 110 associated with the row. For example, where the memory cell 108 is located in the first row, the row decoder 104 is configured to provide the address signal to the first wordline 110a. In this way, the row decoder 104 grants the control logic 106 access to the first row of memory cells 108, for example.

The control logic 106 is configured to perform the desired read/write operation on a memory cell 108 or a column of memory cells 108 corresponding to the column address 118. To do so, the control logic 106 comprises timing logic 120 and communication logic 122. In some embodiments, at least some of the timing logic 120 or the communication logic 122 is implemented via hardware. In some embodiments, at least some of the timing logic 120 or the communication logic 122 is implemented via software.

The timing logic 120 is configured to develop a schedule for performing read/write operations during a cycle on one or more memory cells 108 of the memory array. In some embodiments, such a schedule is developed based upon a plurality of inputs to the timing logic 120. By way of example, the timing logic 120 is configured to use a clock signal CLK, a read enable signal RE, a write enable signal WE, and a control signal CTRL to develop the schedule. The clock signal CLK is provided from a system clock and defines a cycle for the memory arrangement 100. The read enable signal RE indicates whether a read operation is desired during a cycle. The write enable signal WE indicates whether a write operation is desired during a cycle. The control signal CTRL indicates where, within a cycle, it is desirable to perform a read operation or a write operation.

In some embodiments, the schedule that is developed by the timing logic 120 is output to the communication logic 122 as one or more timing signals. By way of example, a schedule for performing read operations, if the read enable signal RE indicates a desire to perform a read operation during a cycle, is output to the communication logic 122 via a read signal R, and a schedule for performing write operations, if the write enable signal WE indicates a desire to perform a write operation during a cycle, is output to the communication logic 122 via a write signal W.

The communication logic 122 is configured to perform read/write operations on the memory cells 108 using a pair of bitlines 112, 114 based upon the timing signals received from the timing logic 120 and the column address 118. By way of example, when the timing signals are indicative of a desire to perform a read operation, the communication logic 122 is configured to detect voltages applied to the pair of bitlines 112,114 corresponding to the column address 118. In some embodiments, the detected voltages, or a corresponding data value, are output from control logic 106 via an input/output (I/O) channel 132. As another example, when the timing signals are indicative of a desire to perform a write operation, the communication logic 122 is configured to apply programming voltages, such as specified via the I/O channel 132, to a pair of bitlines 112, 114 corresponding to the column address 118.

FIG. 1b illustrates an example symbol 134 that, in some embodiments, is representative of the memory arrangement 100 of FIG. 1a. The "D" and the "0" represent pins through which input data and output data are transmitted, such as via the I/O channel 132. "CTRL" represents a pin through which the control signal CTRL is transmitted. "WE" represents a pin through which the write enable signal WE is transmitted. "RE" represents a pin through which the read enable signal RE is transmitted. "RA" represents a pin through which the row address 116 is transmitted. "CA" represents a pin through which the column address 118 is transmitted. "CLK" represents a pin through which the clock signal CLK is transmitted.

Figure 2:
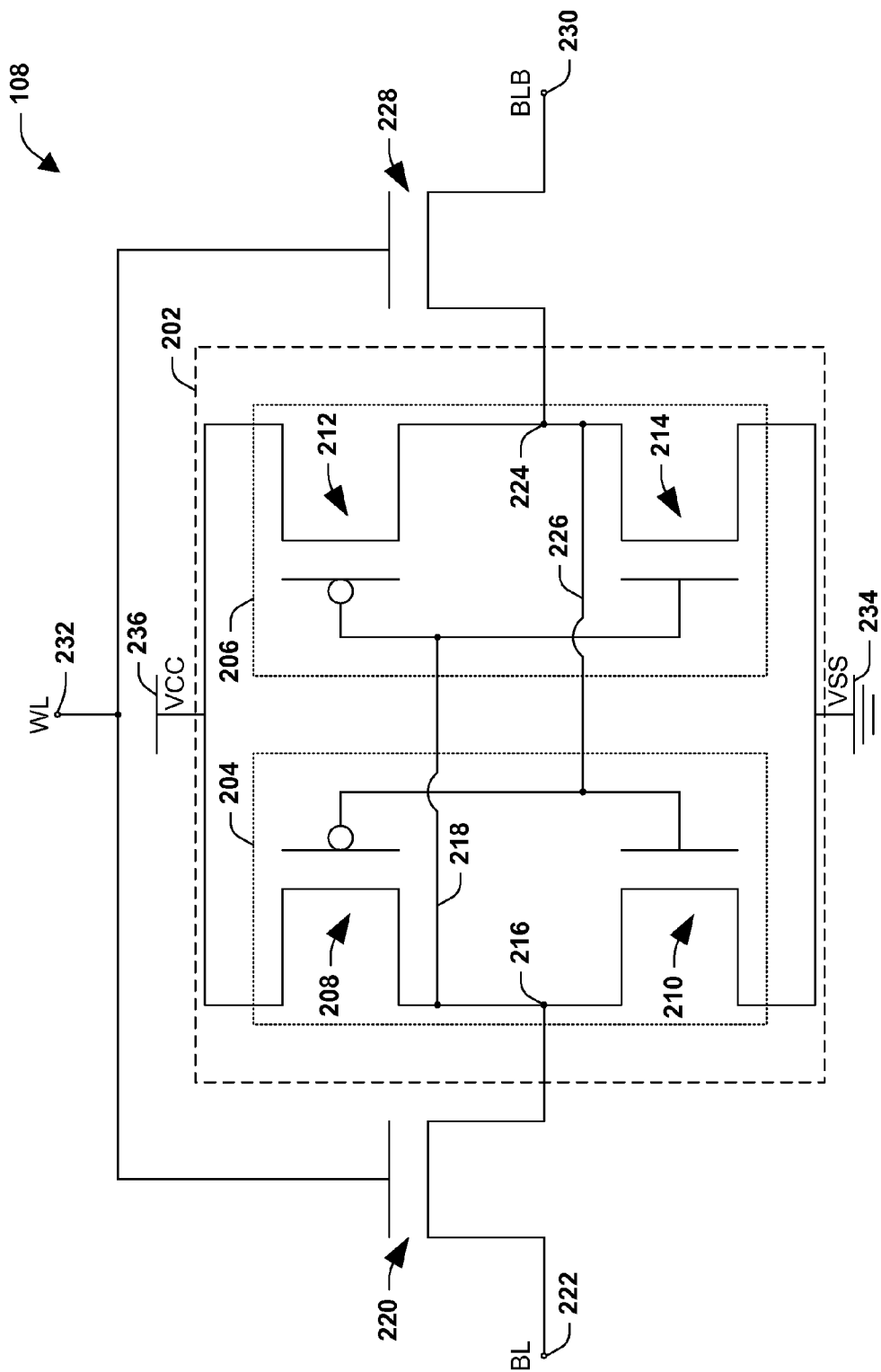
FIG. 2 is illustrates a memory cell, according to some embodiments.

FIG. 2 illustrates a circuit diagram of an example memory cell 108. For example, FIG. 2 illustrates a circuit diagram of a six-transistor (6T) SRAM cell. It will be appreciated that while a 6T SRAM cell is described with respect to FIG. 2, in other embodiments, the memory cell 108 is arranged differently than illustrated and described herein. In some embodiments, the memory array 102 comprises four-transistor (4T) SRAM cells, where two of the transistors shown in the 6T configuration are replaced with resistors. In some embodiments, the memory array 102 comprises eight-transistor (8T) SRAM cells.

The example memory cell 108 comprises a latch portion 202 comprising a first inverter 204 and a second inverter 206. In some embodiments, the first inverter 204 and the second inverter 206 are cross-coupled via a first cross-coupling element 218 and a second cross-coupling element 226. The first inverter 204 comprises a first pull-up transistor 208 and a first pull-down transistor 210, and the second inverter 206 comprises a second pull-up transistor 212 and a second pull-down transistor 214. Example pull-up transistors 208, 212 and pull-down transistors 210, 214 include p-type field effect transistors (pFETs), n-type field effect transistors (nFETs), p-type metal-oxide semiconductor field effect transistors (pMOSFETs), n-type metal-oxide semiconductor field effect transistors (nMOSFETs), an arrangement of two or more FETs or MOSFETs, etc.

A first memory node 216 is formed at the first inverter 204 between the first pull-up transistor 208 and the first pull-down transistor 210. In embodiments where the first inverter 204 and the second inverter 206 are cross-coupled, the first memory node 216 is coupled to a gate of the second pull-up transistor 212 and a gate of the second pull-down transistor 214 via the first cross-coupling element 218.

The first memory node 216 is written to and read from through a first access transistor 220, which is configured to control access, of the control logic 106, to the first memory node 216. The first memory node 216 is coupled, through the first access transistor 220, to the first bitline 112 (BL) at a first terminal 222.

A second memory node 224 is formed at the second inverter 206 between the second pull-up transistor 212 and the second pull-down transistor 214. In embodiments where the first inverter 204 and the second inverter 206 are cross-coupled, the second memory node 224 is coupled to a gate of the first pull-up transistor 208 and a gate of the first pull-down transistor 210 via a second cross-coupling element 226.

The second memory node 224 is written to and read from through a second access transistor 228, which is configured to control access, of the control logic 106, to the second memory node 224. The second memory node 224 is coupled, through the second access transistor 228, to a second bitline 114 (BLB) via a second terminal 230. In some embodiments, the second bitline 114 is a complement to the first bitline 112 (BL).

Example configurations for the first access transistor 220 and the second access transistor 228 include pFET configurations, nFET configurations, pMOSFET configurations, nMOSFET configurations, or other configurations configured to selectively couple the first bitline 112 and the second bitline 114 to the latch 202. Gates of the first access transistor 220 and the second access transistor 228 are mutually coupled to a wordline 110 (WL) via a third terminal 232.

An example operation of the memory cell 108 is as follows. For illustration, the row decoder 104 is applying a voltage via the wordline 110 that causes the first access transistor 220 and the second access transistor 228 to turn-off. Further, the first memory node 216 is at a high voltage state. As a result, the second pull-up transistor 212 is turned-off and the second pull-down transistor 214 is turned-on. Accordingly, a voltage at the second memory node 224 is pulled to ground (VSS) 234. Such a low voltage state at the second memory node 224 turns on the first pull-up transistor 208 and turns off the first pull-down transistor 210, causing the first memory node to be sustained at the high voltage state via the voltage supply (VCC) 236. When the second memory node 224 is at a high voltage state, the opposite effect occurs, causing the second memory node 224 to be sustained at the high voltage state via the voltage supply 236 while the first memory node 216 is sustained at the low voltage state via ground 234.

During a read operation, the row decoder 104 is configured to apply a voltage via the wordline 110 (WL) that causes the first access transistor 220 and the second access transistor 228 to turn-on. In this way, the control logic 106 is granted access to the first memory node 216 and the second memory node 224. A logic state of the first memory node 216 and the second memory node 224 are read by the control logic 106 by detecting the voltages applied to the bitline 112 (BL) and complementary bitline 114 (BLB) by the first memory node 216 and the second memory node 224, respectively.

During a write operation, the row decoder 104 is configured to apply a voltage via the wordline 110 (WL) that causes the first access transistor 220 and the second access transistor 228 to turn-on, granting the control logic 106 access to the first memory node 216 and the second memory node 224. While access is granted, the control logic 106 is configured to apply programming voltages to the first memory node 216 and the second memory node 224 via the bitline 112 (BL) and complementary bitline 114 (BLB), respectively, to program the first memory node 216 and the second memory node 224.

As described with respect to FIG. 1a, the timing logic 120 is configured to determine a schedule for performing read/write operations during a cycle based upon a set of inputs supplied to the timing logic 120.

FIGS. 3-8 illustrate example schedules for performing read/write operations when a particular set of inputs are provided to the timing logic 120. The inputs include a clock signal CLK, a read enable signal RE, a write enable signal WE, and a control signal CTRL. The outputs include a read signal R and a write signal W. As will be further described below, properties of the read signal R and the write signal W, such as voltage properties, are dependent upon properties of the clock signal CLK, the read enable signal RE, the write enable signal WE, and the control signal CTRL, such as voltage properties of respective input signals CLK, RE, WE, CTRL. In some embodiments, at least one of the read signal R or the write signal W is trigged by a rising edge of the clock signal CLK in combination with the other input signals RE, WE, CTRL. In some embodiments, at least one of the read signal R or the write signal W are self-timing pulse signals. In some embodiments, a signal applied late in the cycle is triggered by a tailing edge of an early occurring signal or triggered by an earlier occurring dummy signal. By way of example, in FIG. 4, where the read signal R occurs late in a cycle, in some embodiments, the read signal W is triggered by a dummy signal applied earlier in the cycle. As another example, with respect to FIG. 7, the late-occurring write signal W is triggered by the tailing edge of the earlier-occurring read signal R in some embodiments.

Respective input signals CLK, RE, WE, CTRL and output signals R, W are respectively switched between a first voltage and a second voltage, which is different than the first voltage. In the following examples, a signal that is applying the first voltage is referred to as LOW and a signal that is applying the second voltage is referred to as HIGH.

Moreover, in the following examples, a desire to perform a read operation is indicated by a LOW read enable signal RE and a desire to perform a write operation is indicated by a LOW write enable signal WE. The control signal CTRL is used to control when, within a cycle, a read/write operation is to occur. For example, a HIGH control signal CTRL indicates a desire to perform the read operation early in the cycle and a LOW control signal CTRL indicates a desire to perform the read operation late in the cycle. The reverse is true with respect to a write operation. That is, a LOW control signal CTRL indicates a desire to perform the write operation early in the cycle and a HIGH control signal CTRL indicates a desire to perform the write operation late in the cycle. It is to be appreciated that the foregoing voltage controls are merely example controls and are not intended to limit the scope of the application. For example, in another embodiment, the desire to perform a read operation is indicated by a HIGH read enable signal RE instead of a LOW read enable signal RE.

In some embodiments, the schedule for a cycle is devised temporally proximate a start of the cycle. In such embodiments, changes to one or more of the input signals RE, WE, CTRL during the cycle do not affect a schedule for the cycle, but do affect the schedule for a subsequent cycle if not returned to a previous state before the start of the subsequent cycle, for example.

With respect to the output signals, a read operation is performed on a memory cell when the read signal R goes HIGH and a write operation is performed on the memory cell when the write signal W goes HIGH. Typically, a read operation and a write operation are not performed concurrently. For example, in some embodiments, the timing logic is configured to inhibit a read operation from occurring concurrently with a write operation.

Figure 3:
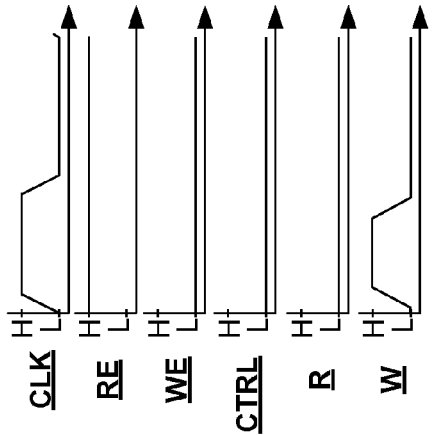
FIG. 3 illustrates an example early-read operation, according to some embodiments.

With reference to FIG. 3, an example early-read operation is illustrated. The read enable signal RE is LOW, indicating a desire to perform a read operation during the cycle. The write enable signal WE is HIGH, indicating a desire not to perform a write operation during the cycle. The control signal CTRL is HIGH indicating a desire to perform the read operation early in the cycle, such as during a first time window when the clock signal CLK is HIGH. Accordingly, the timing logic 120 outputs a HIGH read signal R during a first portion of the cycle, causing a read operation to be performed early in the cycle. Due to the write enable signal WE indicating no desire to perform a write operation during the cycle, the timing logic 120 outputs a LOW write signal W for the duration of the cycle.

Figure 4:
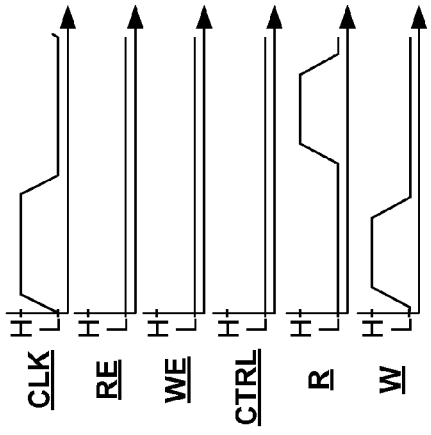
FIG. 4 illustrates an example late-read operation, according to some embodiments.

With reference to FIG. 4, an example late-read operation is illustrated. In contrast with FIG. 3, the control signal CTRL is LOW, indicating a desire to perform the read operation late in the cycle, such as during a second time window when the clock signal CLK is LOW. Accordingly, the timing logic 120 outputs a HIGH read signal R during a second portion of the cycle, causing a read operation to be performed late in the cycle. Again, due to the HIGH write enable signal WE, the timing logic 120 outputs a LOW write signal W for the duration of the cycle such that no write operation to be performed during the cycle.

Figure 5:
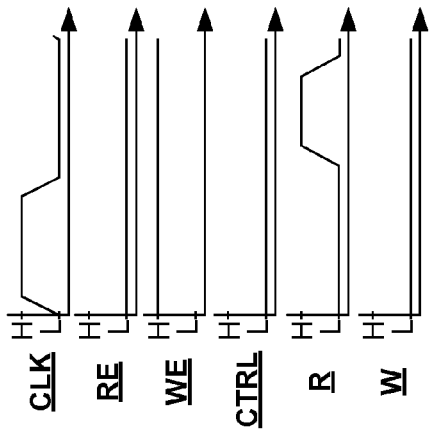
FIG. 5 illustrates an example early-write operation, according to some embodiments.

With reference to FIG. 5, an example early-write operation is illustrated. The read enable signal RE is HIGH, indicating a desire not to perform a read operation during the cycle. The write enable signal WE is LOW, indicating a desire to perform a write operation during the cycle. The control signal CTRL is LOW indicating a desire to perform the write operation early in the cycle, such as during a first time window when the clock signal CLK is HIGH. Accordingly, the timing logic 120 outputs a HIGH write signal W during a first portion of the cycle, causing a write operation to be performed early in the cycle. Due to the read enable signal RE indicating no desire to perform a read operation during the cycle, the timing logic 120 outputs a LOW read signal R for the duration of the cycle.

Figure 6:
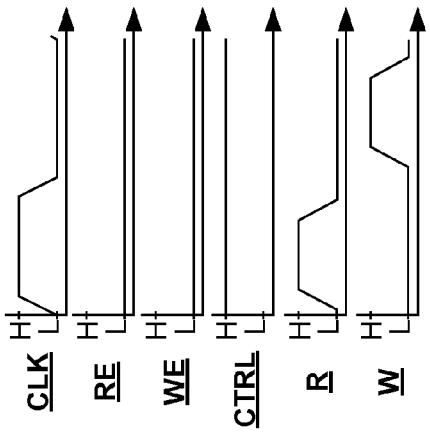
FIG. 6 illustrates an example late-write operation, according to some embodiments.

With reference to FIG. 6, an example late-write operation is illustrated. In contrast with FIG. 5, the control signal CTRL is HIGH, indicating a desire to perform the write operation late in the cycle, such as during a second time window when the clock signal CLK is LOW. Accordingly, the timing logic 120 outputs a HIGH write signal W during a second portion of the cycle, causing a write operation to be performed late in the cycle. Again, due to the HIGH read enable signal RE, the timing logic 120 outputs a LOW read signal R for the duration of the cycle causing no read operation to be performed during the cycle.

Figure 7:
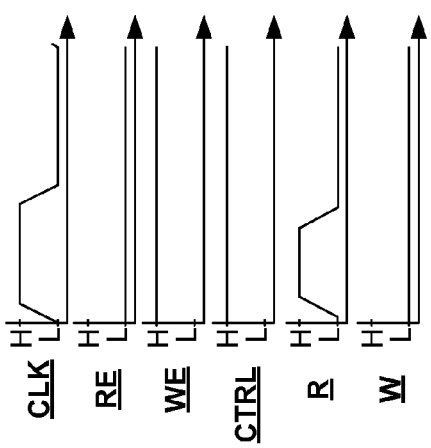
FIG. 7 illustrates an example read-then-write operation, according to some embodiments.

With reference to FIG. 7, an example read-then-write operation is illustrated. The read enable signal RE and the write enable signal WE are LOW, indicating a desire to perform both a read operation and a write operation during the cycle. The control signal CTRL is HIGH indicating a desire to perform the read operation early in the cycle, such as during a first time window when the clock signal CLK is HIGH, and to perform the write operation late in the cycle, such as during a second time window when the clock signal CLK is LOW. Accordingly, the timing logic 120 outputs a HIGH read signal R during the first time window and outputs a HIGH write signal W during the second time window, causing the read operation to be performed before the write operation.

Figure 8:
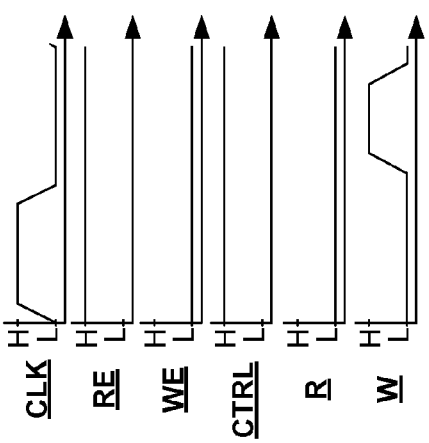
FIG. 8 illustrates an example write-then-read operation, according to some embodiments.

With reference to FIG. 8, an example write-then-read operation is illustrated. In contrast with FIG. 7, the control signal CTRL is LOW, indicating a desire to perform the read operation late in the cycle, such as during a second time window when the clock signal CLK is LOW, and to perform the write operation early in the cycle, such as during a first time window when the clock signal CLK is HIGH. Accordingly, the timing logic 120 outputs a HIGH write signal W during the first time window and outputs a HIGH read signal R during the second time window, causing the write operation to be performed before the read operation. In some embodiment, the write-then-read operation implements a write through function. For example, data written to a memory cell 108 during the first time window can be read out of the memory cell 108 during the second time window. By way of example, with respect to a memory cell 108 configured as a two port register file, data written to a first port of the two port register file during the first time window is read out from the second port of the two port register file during the second time window.

In some embodiments, the timing logic 120 is configured to switch between the foregoing read/write operations between cycles based upon the properties of the received input signals CLK, RE, WE, CTRL. In this way, a time window during which at least one of a read operation or a write operation is performed is adjusted. By way of example, a change in the control signal CTRL applied to the timing logic 120 between a first cycle and a second cycle may cause a read-then-write operation to be performed during the first cycle and a write-then-read operation to be performed during the second cycle. In some embodiments, the second cycle is a cycle that immediately follows the first cycle. As another example, changes in the control signal CTRL and the write-enable signal between a first cycle and a second cycle cause a read-then-write operation to be performed during the first cycle and a late-read operation to be performed during the second cycle.

It is to be appreciated that the read-then-write operation shown in FIG. 7 can be modified to derive the early-read operation shown in FIG. 3 by switching the write enable signal WE from LOW to HIGH. Further, the read-then-write operation shown in FIG. 7 can be modified to derive the late-write operation shown in FIG. 6 by switching the read enable signal RE from LOW to HIGH.

It is to be appreciated that the write-then-read operation shown in FIG. 8 can be modified to derive the late-write operation shown in FIG. 4 by switching the write enable signal WE from LOW to HIGH. Further, the write-then-read operation shown in FIG. 8 can be modified to derive the early-write operation shown in FIG. 5 by switching the read enable signal RE from LOW to HIGH.

Figure 9:
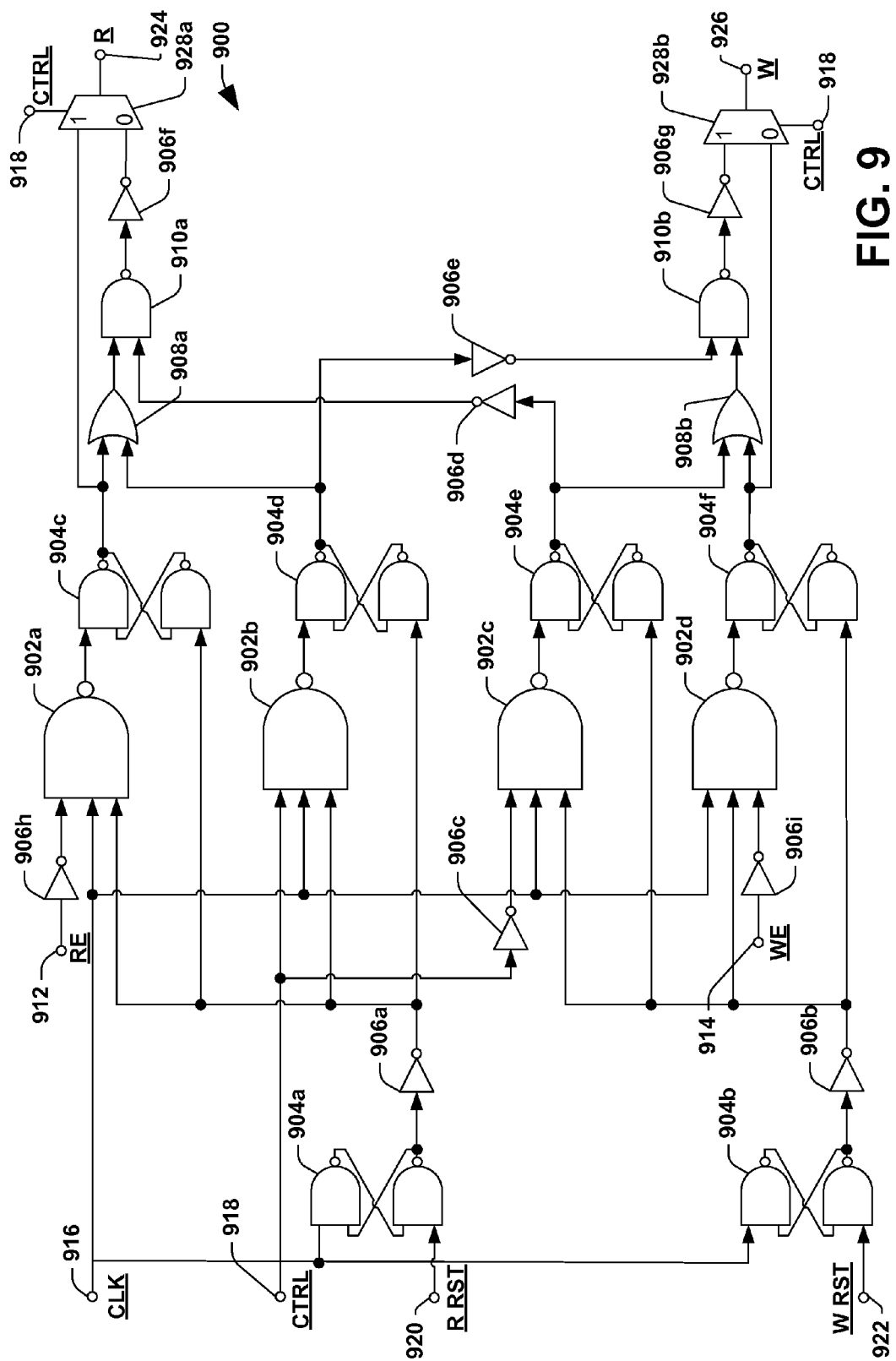
FIG. 9 illustrates an example logic circuit of timing logic configured to devise a schedule for performing read/write operations during a cycle, according to some embodiments.

FIG. 9 illustrates an example logic circuit 900 for the timing logic 120. In some embodiments, at least some of the logic circuit 900 is implemented via hardware, such as via transistors and/or logic gates. In other embodiments, at least some of the logic circuit 900 is implemented via software, such as stored in memory and executed via one or more processing units. Moreover, it is to be appreciated that the logic circuit 900 is merely provided as an example and that other equivalent or non-equivalent logic circuits 900 that achieve similar results are also contemplated.

The logic circuit 900 comprises four three-input negated AND (NAND) gates 902, six NAND-gate latches 904, nine NOT gates 906, two OR gates 908, two two-input NAND gates 910, and two multiplexers 928 (MUXs). A read enable signal RE is received at a first input terminal 912, inverted by an eighth NOT gate 906h, and applied to a first three-input NAND gate 902a. A write enable signal WE is received at a second input terminal 914, inverted by a ninth NOT gate 906i, and applied to a fourth three-input NAND gate 902d. A clock signal CLK is provided to respective three-input NAND gates 902, a first NAND-gate latch 904a, and a second NAND-gate latch 904b via a third input terminal 916. A control signal CTRL is provided to a second three-input NAND gate 902b and a selector input of the two MUXs 928 via a fourth input terminal 918. The control signal CTRL is further inverted by a third NOT gate 906c and applied to a third three-input NAND gate 902c. In some embodiments, application of the control signal CTRL to the second three-input NAND gate and concurrent application of an inverted control signal CTRL to the third three-input NAND gate 902c is configured to inhibit a read operation and a write operation from being performed concurrently.

A fifth input terminal 920 is configured to receive a read reset signal R RST for resetting a read signal R. The read reset signal R RST is provided to the first NAND-gate latch 904a, and in some embodiments, controls a pulse width of the read signal R. By way of example, at a desired end of a read operation, a voltage of R RST is changed to trigger the read signal R to go LOW. In this way, the read reset signal R RST facilitates controlling whether a read operation has a duration of 5 ms or 10 ms, for example.

A sixth input terminal 922 is configured to receive a write reset signal W RST for resetting a write signal W. The write reset signal W RST is provided to the second NAND-gate latch 904b, and in some embodiments, controls a pulse width of the write signal W. By way of example, at a desired end of a write operation, a voltage of the write reset signal W RST is changed to trigger the write signal W to go LOW.

The read signal R is output from the logic circuit 900 at a first output terminal 924. The write signal W is output from the logic circuit 900 at a second output terminal 926.

Figure 10:
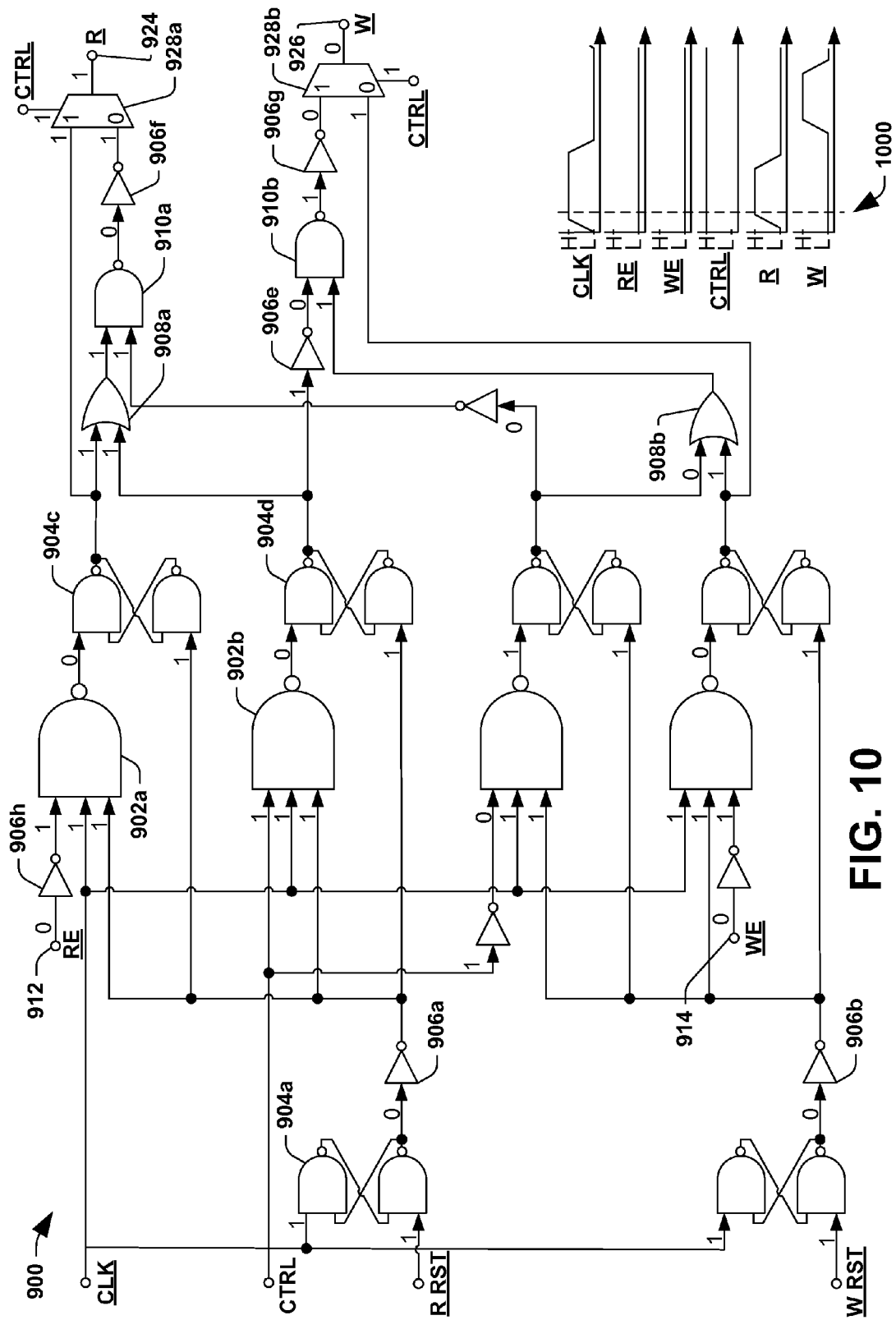
FIG. 10 illustrates a state of a logic circuit at a first time during a read-then-write operation, according to some embodiments.
Figure 11:
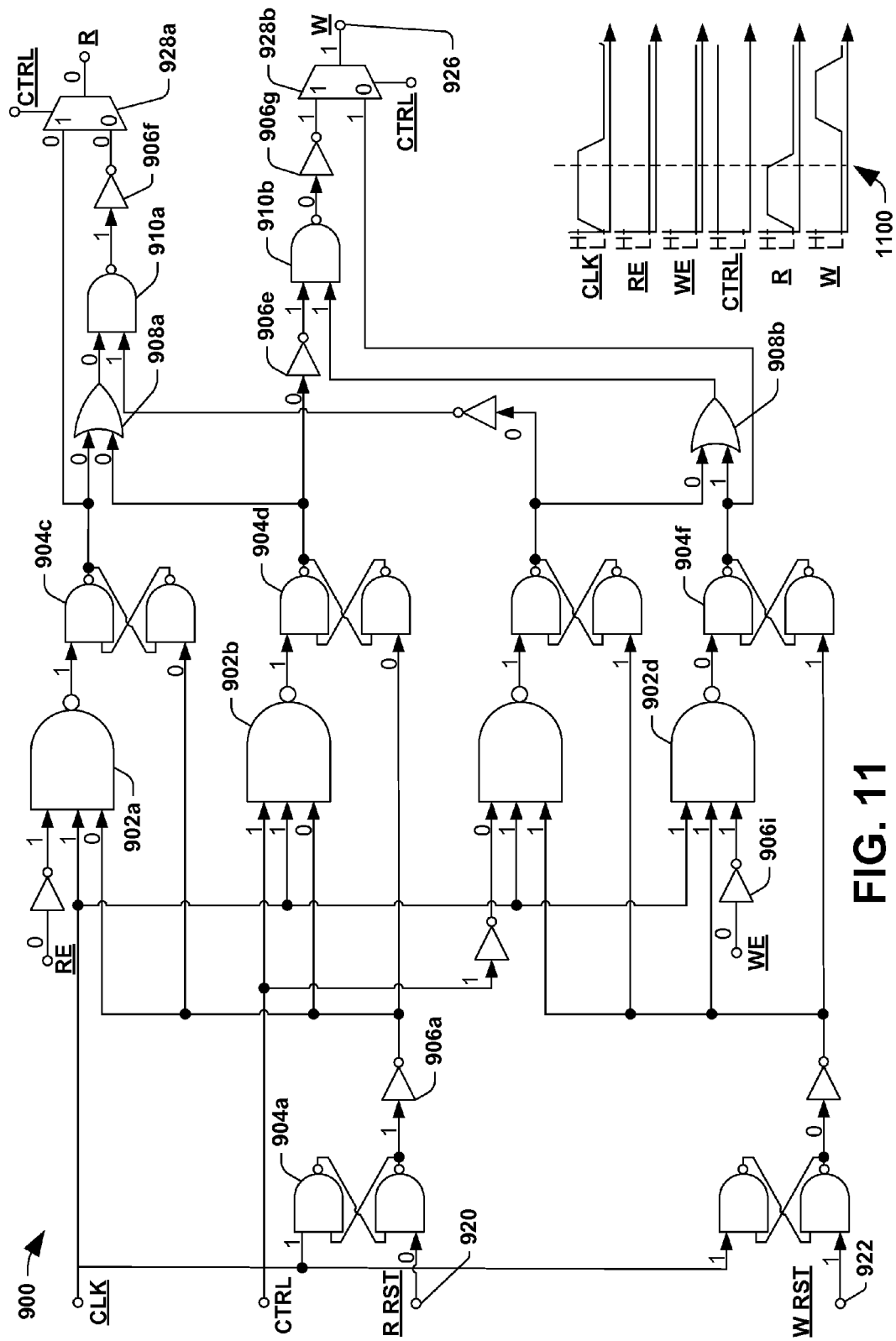
FIG. 11 illustrates a state of a logic circuit at a second time during a read-then-write operation, according to some embodiments.
Figure 12:
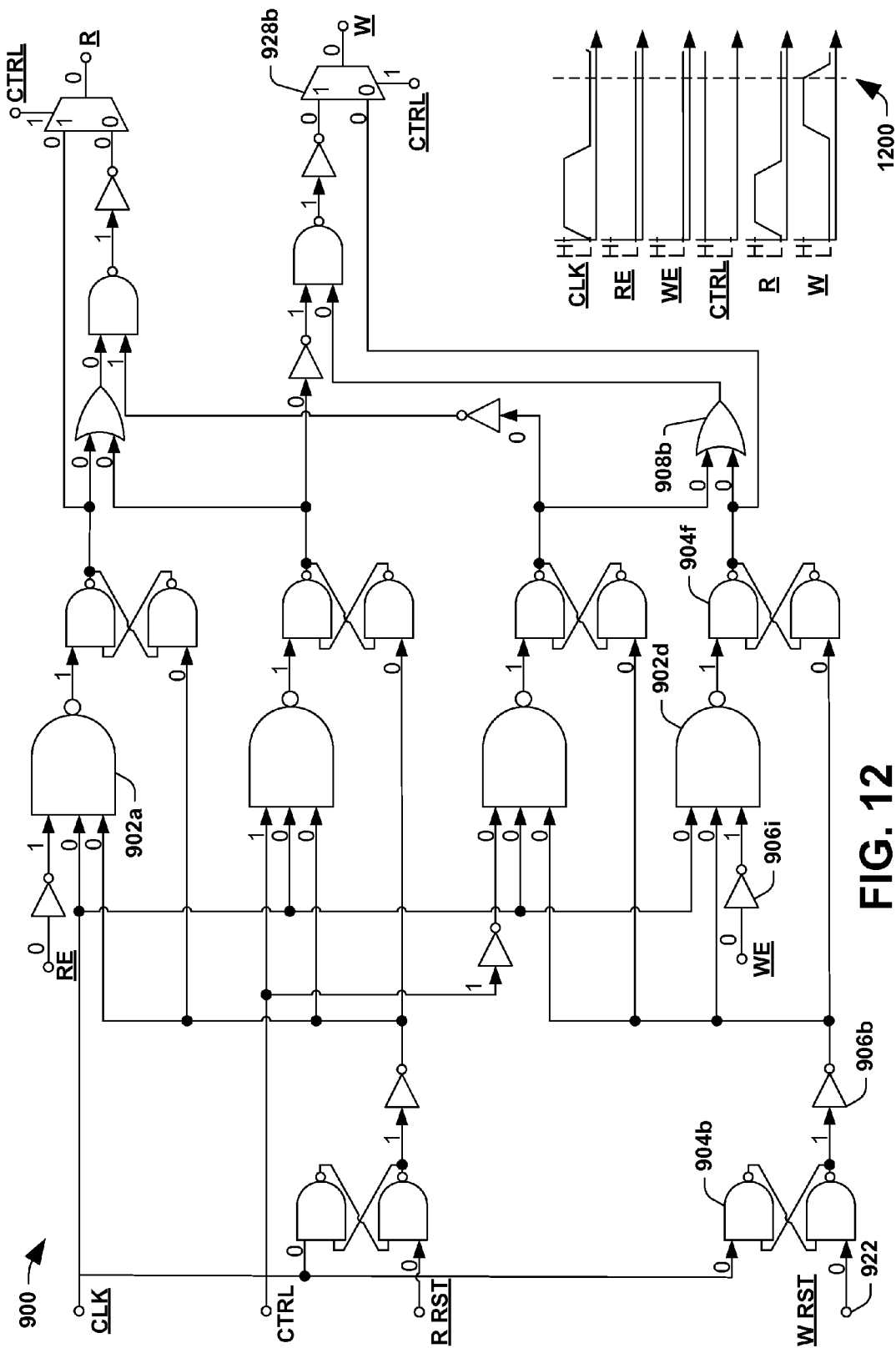
FIG. 12 illustrates a state of a logic circuit at a third time during a read-then-write operation, according to some embodiments.

FIGS. 10-12 illustrate example states of the logic circuit 900 during a read-then-write operation, such as described with respect to FIG. 7. For ease of clarity, the read-then-write schedule described with respect to FIG. 7 has been reproduced in FIGS. 10-12 to explain what part of the read-then-write operation is being performed. Moreover, HIGH signals are represented by a "1" and LOW signals are represented by a "0."

It will be appreciated the logic circuit 900 can exhibit similar states to those shown in FIGS. 10-12 during an early-read operation, such as described with respect to FIG. 3, except that the write enable signal WE received at the second input terminal 914 is HIGH. This change in the write enable signal WE causes the following changes to the state of the circuit shown in FIG. 11 (when the write operation would occur if the write enable signal WE were LOW): the ninth NOT gate 906i outputs a LOW signal, the fourth three-input NAND gate 902d outputs a HIGH signal, the sixth NAND-gate latch 904f outputs a LOW signal, the second OR gate 908b outputs a LOW signal, the second two-input NAND gate 910b outputs a HIGH signal, and the seventh NOT gate 906g outputs a LOW signal, which is passed through the second MUX 928b due to the control signal CTRL being HIGH. Thus, for an early-read operation, the output at the second output terminal 926 is LOW instead of HIGH as shown in FIG. 11, causing a write operation to not occur during the cycle shown in FIGS. 10-12.

It will also be appreciated the logic circuit 900 can exhibit similar states to those shown in FIGS. 10-12 during a late-write operation, such as described with respect to FIG. 6, except that the read enable signal RE received at the first input terminal 912 is HIGH. This change in the read enable signal RE causes the following changes to the state of the circuit shown in FIG. 10 (when a read operation would occur if the read enable signal RE were LOW): the eighth NOT gate 906h outputs a LOW signal, the first three-input NAND gate 902a outputs a HIGH signal, and the third NAND-gate latch 904c outputs a LOW signal, which is passed through the first MUX 928a due to the control signal CTRL being HIGH. Thus, for a late-write operation, the output at the first output terminal 924 is LOW instead of HIGH as shown in FIG. 10, causing a read operation to not occur during the cycle shown in FIGS. 10-12.

With respect to FIG. 10, the state of the logic circuit 900 at a first time 1000 is illustrated. Turning first to the write operation, the second three-input NAND gate 902b outputs a LOW signal due to the clock signal CLK, control signal CTRL, and an output of the first NOT gate 906a being HIGH. When the LOW output of the second three-input NAND gate 902b and the HIGH output of the first NOT gate 906a are applied to the fourth NAND-gate latch 904d, the output of the fourth NAND-gate latch 904d is HIGH. The HIGH signal output from the fourth NAND-gate latch 904d is inverted by the fifth NOT gate 906e, causing a LOW signal to be output from the fifth NOT gate 906e. The LOW output from the fifth NOT gate 906e is combined with a HIGH output from the second OR gate 908b causing the second two-input NAND gate 910b to output a HIGH signal. The HIGH output of the two-input NAND gate 910b is inverted by the seventh NOT gate 906g and passed through the second MUX 928b due to second MUX 928b received a HIGH control signal CTRL. Thus a LOW write signal W is output from the second output terminal 926.

Turning to the read operation, the LOW read enable signal RE is applied to the eighth NOT gate 906h, causing the eighth NOT gate 906h to apply a HIGH signal to the first three-input NAND gate 902a. The clock signal CLK, which is HIGH, and a HIGH output of the first NOT gate 906a are also applied to the first three-input NAND gate 902a, causing the first three-input NAND gate 902a to output a LOW signal. The LOW signal output from the first three-input NAND gate 902a and the HIGH output of the first NOT gate 906a are applied to the third NAND-gate latch 904c, causing the third NAND-gate latch 904c to output a HIGH signal. Due to a HIGH control signal CTRL being applied to the first MUX 928a, the HIGH output of the third NAND-gate latch 904c is passed through the first MUX 928a, causing the read signal R to be HIGH. Thus, a HIGH read signal R is output from the first output terminal 924.

With respect to FIG. 11, the state of the logic circuit 900 at a second time 1100 is illustrated. At the second time 1100, a LOW read reset signal R RST is applied to the fifth input terminal 920 to trigger the read signal R to go LOW. The LOW read reset signal R RST is combined with the HIGH clock signal CLK to cause the output of the first NAND-gate latch 904a to switch from LOW to HIGH. The HIGH signal output from the first NAND-gate latch 904a is inverted by the first NOT gate 906a and applied to, among other things, the first three-input NAND gate 902a causing the output of the first three-input NAND gate 902a to go HIGH. The HIGH output of the first three-input NAND gate 902a and the LOW output of the first NOT gate 906a are applied to the third NAND-gate latch 904c, causing the output of the third NAND-gate latch 904c to go LOW. Due to a HIGH control signal CTRL being applied to the first MUX 928a, the LOW output of the third NAND-gate latch 904c is passed through the first MUX 928a, causing the read signal R to go LOW. In this way, the timing logic 120 turns off the read operation.

With respect to the write operation, the LOW output of the first NOT gate 906a is applied to the second three-input NAND gate 902b, causing the output of the second three-input NAND gate 902b to go HIGH. The HIGH output of the second three-input NAND gate 902b and the LOW output of the first NOT gate 906a are applied to the fourth NAND-gate latch 904d, causing the output of the fourth NAND-gate latch 904d to go LOW. The LOW signal output by the fourth NAND-gate latch 904d is inverted by the fifth NOT gate 906e to apply a HIGH signal to the second two-input NAND gate 910b. Because both inputs to the second two-input NAND gate 910b are now HIGH, the output of the second two-input NAND gate 910b switches to LOW. The LOW signal output by the second two-input NAND gate 910b is inverted by the seventh NOT gate 906g and passed through the second MUX 928b due to a HIGH control signal CTRL being applied to the second MUX 928b. Thus, a HIGH write signal W is output from the second output terminal 926, causing a write operation to be initialized during a second portion of the cycle.

With respect to FIG. 12, the state of the logic circuit 900 at a third time 1200 is illustrated. To trigger the write signal W to go LOW and the write operation to cease, a LOW write reset signal W RST is applied to the sixth input terminal 922. The LOW write reset signal R RST is combined with a LOW clock signal CLK to cause the output of the second NAND-gate latch 904b to switch from LOW to HIGH. The HIGH signal output from the second NAND-gate latch 904b is inverted by the second NOT gate 906b, causing the output of the second NOT gate 906b to go LOW. The LOW clock signal CLK, LOW output of the second NOT gate 906b, and HIGH output of the ninth NOT gate 906i cause the output of the fourth three-input NAND gate 902d to be HIGH. The HIGH output of the fourth three-input NAND gate 902d and the LOW output of the second NOT gate 906b cause the sixth NAND-gate latch 904f to go LOW. The LOW output of the sixth NAND-gate latch 904f is passed through the second MUX 928b due to a HIGH control signal CTRL being applied to the second MUX 928b. Thus, the write signal W goes LOW, causing a write operation to turn off.

Figure 13:
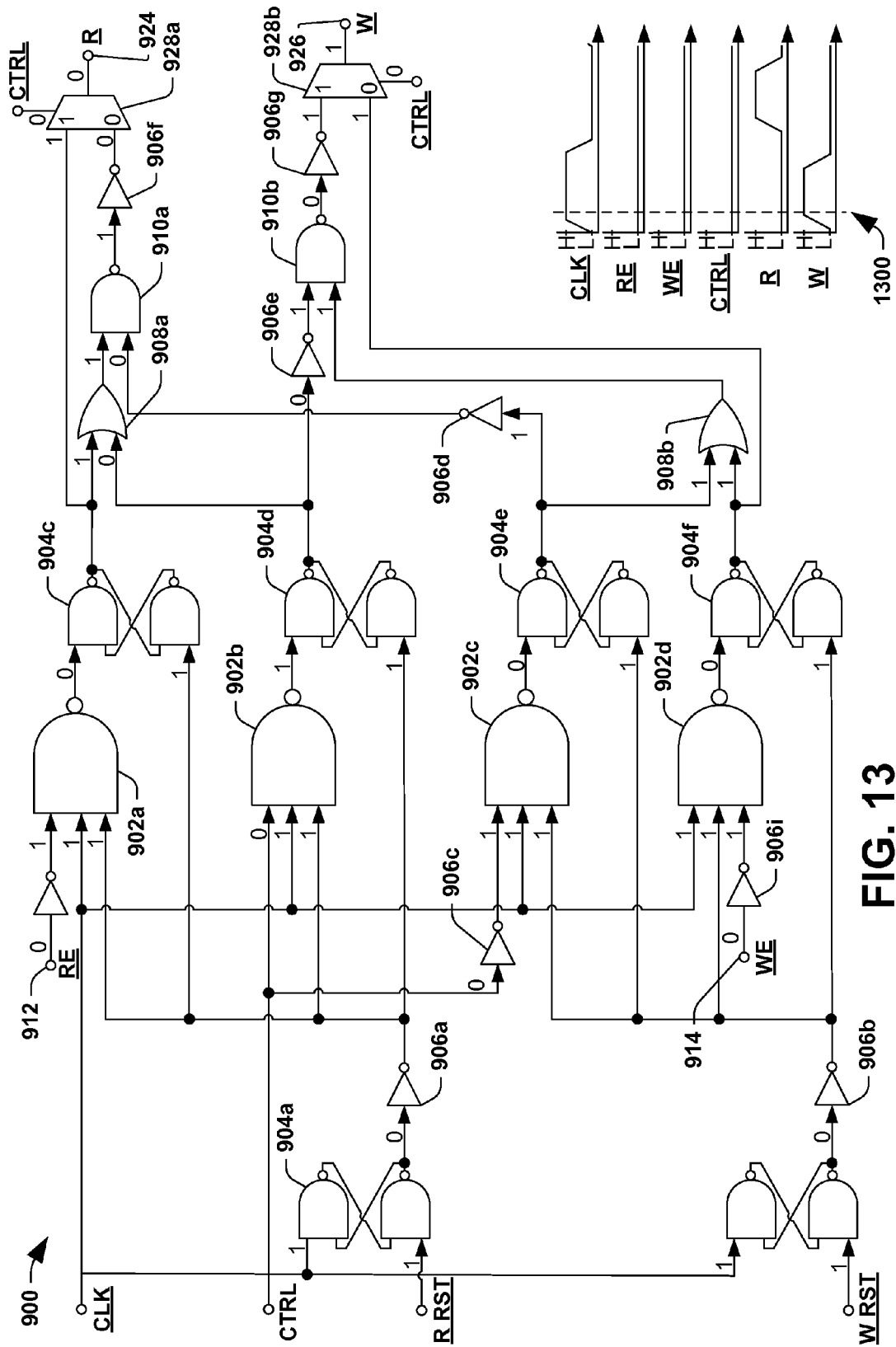
FIG. 13 illustrates a state of a logic circuit at a first time during a write-then-read operation, according to some embodiments.
Figure 14:
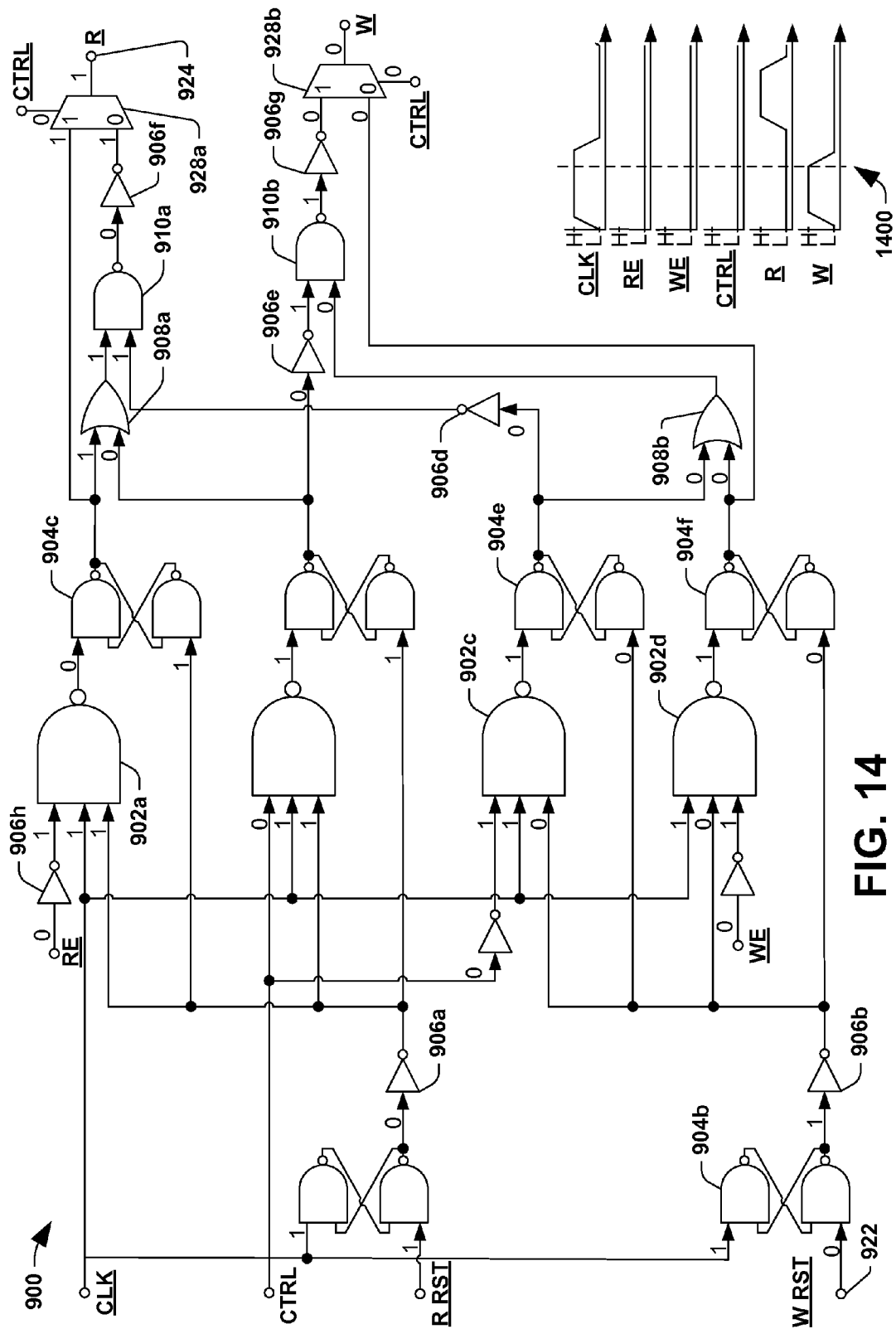
FIG. 14 illustrates a state of a logic circuit at a second time during a write-then-read operation, according to some embodiments.
Figure 15:
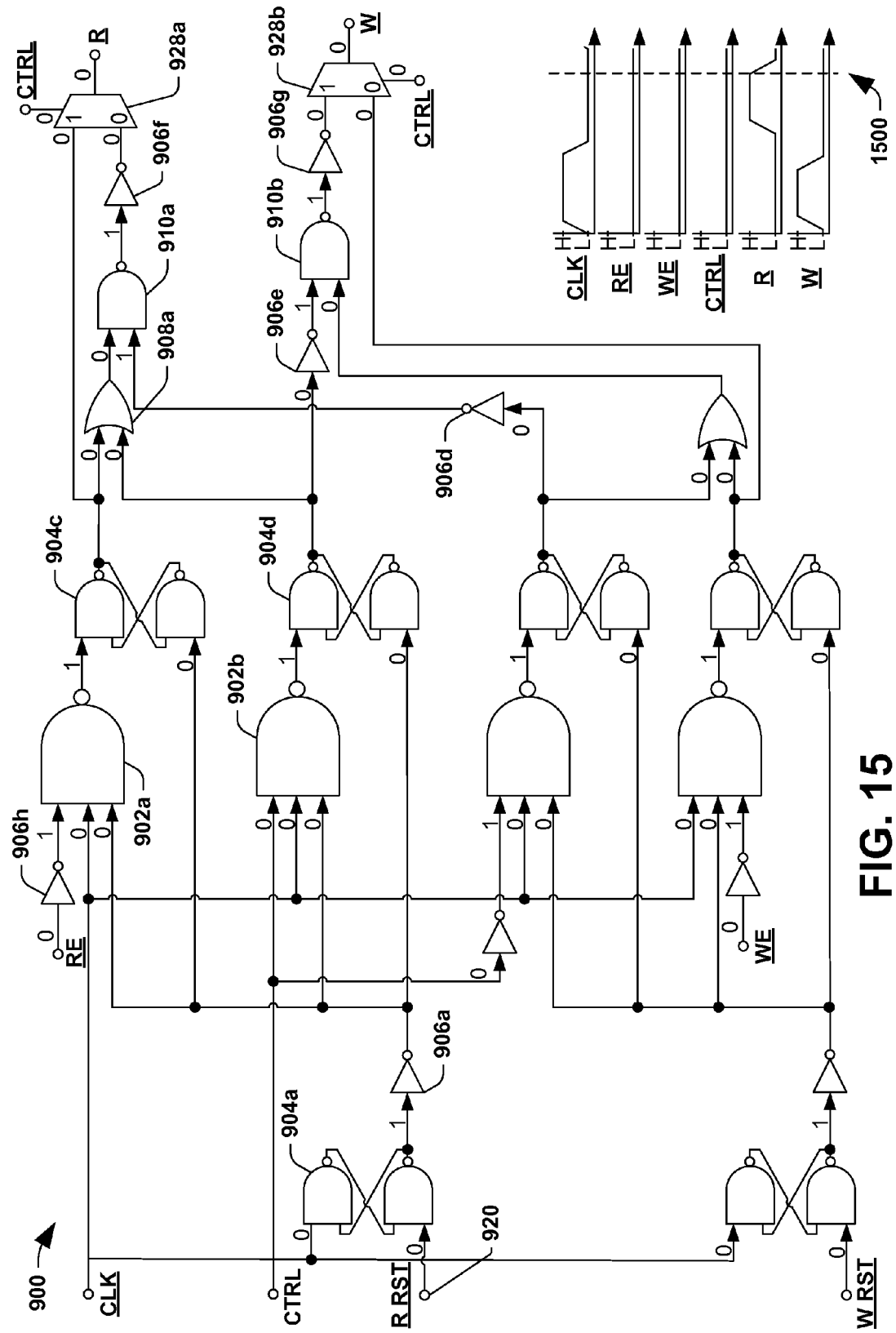
FIG. 15 illustrates a state of a logic circuit at a third time during a write-then-read operation, according to some embodiments.

FIGS. 13-15 illustrate example states of the logic circuit 900 during a write-then-read operation, such as described with respect to FIG. 8. For ease of clarity, the write-then-read schedule described with respect to FIG. 8 has been reproduced in FIGS. 13-15 to explain what part of the write-then-read operation is being performed. Moreover, HIGH signals are represented by a "1" and LOW signals are represented by a "0."

It will be appreciated the logic circuit 900 can exhibit similar states to those shown in FIGS. 13-15 during a late-read operation, such as described with respect to FIG. 4, except that the write enable signal WE received at the second input terminal 914 is HIGH. This change in the write enable signal WE causes the following changes to the state of the circuit shown in FIG. 13 (when the write operation would occur if the write enable signal WE were LOW): the ninth NOT gate 906i outputs a LOW signal, the fourth three-input NAND gate 902d outputs a HIGH signal, and the sixth NAND-gate latch 904f outputs a LOW signal, which is passed through the second MUX 928b due to a LOW control signal CTRL being applied to the second MUX 928b. Thus, for a late-read operation, the output at the second output terminal 926 is LOW instead of HIGH as shown in FIG. 13, causing a write operation to not occur during the cycle shown in FIGS. 13-15.

It will also be appreciated the logic circuit 900 can exhibit similar states to those shown in FIGS. 13-15 during an early-write operation, such as described with respect to FIG. 5, except that the read enable signal RE received at the first input terminal 912 is HIGH. This change in the read enable signal RE causes the following changes to the state of the circuit shown in FIG. 14 (when the read operation would occur if the read enable signal RE were LOW): the eighth NOT gate 906h outputs a LOW signal, the first three-input NAND gate 902a outputs a HIGH signal, the third NAND-gate latch 904c outputs a LOW signal, the first OR gate 908a outputs a LOW signal, the first two-input NAND gate 910a outputs a HIGH signal, and the sixth NOT gate 906f outputs a LOW signal, which is passed through the first MUX 928a due to a LOW control signal CTRL being applied to the first MUX 928a. Thus, for an early-write operation, the output at the first output terminal 924 is LOW instead of HIGH as shown in FIG. 14, causing a read operation to not occur during the cycle shown in FIGS. 13-15.

With respect to FIG. 13, the state of the logic circuit 900 at a first time 1300 is illustrated. Turning first to the read operation, the control signal CTRL is LOW, which is inverted by the third NOT gate 906c to apply a HIGH signal to the third three-input NAND gate 902c. A HIGH clock signal CLK and HIGH output of the second NOT gate 906b are also applied to the third three-input NAND gate 902c, causing the third three-input NAND gate 902c to output a LOW signal. When the LOW output of the third three-input NAND gate 902c and the HIGH output of the second NOT gate 906b are applied to the fifth NAND-gate latch 904e, the output of the fifth NAND-gate latch 904e is HIGH. The HIGH signal output by the fifth NAND-gate latch 904e is inverted by the fourth NOT gate 906d, causing a LOW signal to be output from the fourth NOT gate 906d. The LOW output of the fourth NOT gate 906d and a HIGH output of the first OR gate 908a is applied to the first two-input NAND gate 910a, causing the first two-input NAND gate 910a to output a HIGH signal. The HIGH output of the first two-input NAND gate 910a is inverted by the sixth NOT gate 906f and passed through the first MUX 928a due to a LOW control signal CTRL being applied to the first MUX 928a. Thus, a LOW read signal R is output from the first output terminal 924.

Turning to the write operation, the LOW write enable signal WE is applied to the ninth NOT gate 906i, causing the ninth NOT gate 906i to apply a HIGH signal to the fourth three-input NAND gate 902d. The clock signal CLK, which is HIGH, and a HIGH output of the second NOT gate 906b are also applied to the fourth three-input NAND gate 902d, causing the fourth three-input NAND gate 902d to output a LOW signal. The LOW signal output from the fourth three-input NAND gate 902d and the HIGH output of the second NOT gate 906b are applied to the sixth NAND-gate latch 904f, causing the sixth NAND-gate latch 904f to output a HIGH signal. Due to the control signal CTRL being LOW, the HIGH output of the third NAND-gate latch 904f is passed through the second MUX 928b, causing the write signal W to be HIGH. Thus, a HIGH write signal W is output from the second output terminal 926.

With respect to FIG. 14, the state of the logic circuit 900 at a second time 1400 is illustrated. At the second time 1400, a LOW write reset signal W RST is applied to the sixth input terminal 922 to trigger the write signal W to go LOW and to cause the write operation to cease. The LOW write reset signal W RST is combined with the HIGH clock signal CLK to cause the output of the second NAND-gate latch 904b to switch from LOW to HIGH. The HIGH signal output from the second NAND-gate latch 904b is inverted by the second NOT gate 906b and applied to, among other things, the fourth three-input NAND gate 902d, causing the output of the fourth three-input NAND gate 902d to go HIGH. The HIGH output of the fourth three-input NAND gate 902d and the LOW output of the second NOT gate 906b are applied to the sixth NAND-gate latch 904f, causing the output of the sixth NAND-gate latch 904f to go LOW. Due to the control signal CTRL being LOW, the LOW output of the sixth NAND-gate latch 904f is passed through the second MUX 928b, causing the write signal W to go LOW. In this way, the timing logic 120 turns off the write operation.

With respect to the read operation, the LOW output of the second NOT gate 906b is applied to the third three-input NAND gate 902c, causing the output of the third three-input NAND gate 902c to go HIGH. The HIGH output of the third three-input NAND gate 902c and the LOW output of the second NOT gate 906b are applied to the fifth NAND-gate latch 904e, causing the output of the fifth NAND-gate latch 904e to go LOW. The LOW signal output by the fifth NAND-gate latch 904e is inverted by the fourth NOT gate 906d to apply a HIGH signal to the first two-input NAND gate 910a. Because both inputs to the first two-input NAND gate 910a are now HIGH, the output of the first two-input NAND gate 910a switches to LOW. The LOW signal output by the first two-input NAND gate 910a is inverted by the sixth NOT gate 906f and passed through the first MUX 928a due to the control signal CTRL being LOW. Thus, a HIGH read signal R is output from the first output terminal 924, causing a read operation to be initialized during a second portion of the cycle.

With respect to FIG. 15, the state of the logic circuit 900 at a third time 1500 is illustrated. To trigger the read signal R to go LOW and the read operation to cease, a LOW read reset signal R RST is applied to the fifth input terminal 920. The LOW read reset signal R RST is combined with a LOW clock signal CLK to cause the output of the first NAND-gate latch 904a to switch from LOW to HIGH. The HIGH signal output from the first NAND-gate latch 904a is inverted by the first NOT gate 906a, causing the output of the first NOT gate 906a to go LOW. The LOW clock signal CLK, LOW output of the first NOT gate 906a, and HIGH output of the eighth NOT gate 906h cause the output of the first three-input NAND gate 902a to be HIGH. The HIGH output of the first three-input NAND gate 902a and the LOW output of the first NOT gate 906a cause the third NAND-gate latch 904c to go LOW. The LOW output of the third NAND-gate latch 904c is passed through the first MUX 928a due to the control signal CTRL being LOW. Thus, the read signal R goes LOW, causing a read operation to turn off.

Figure 16:
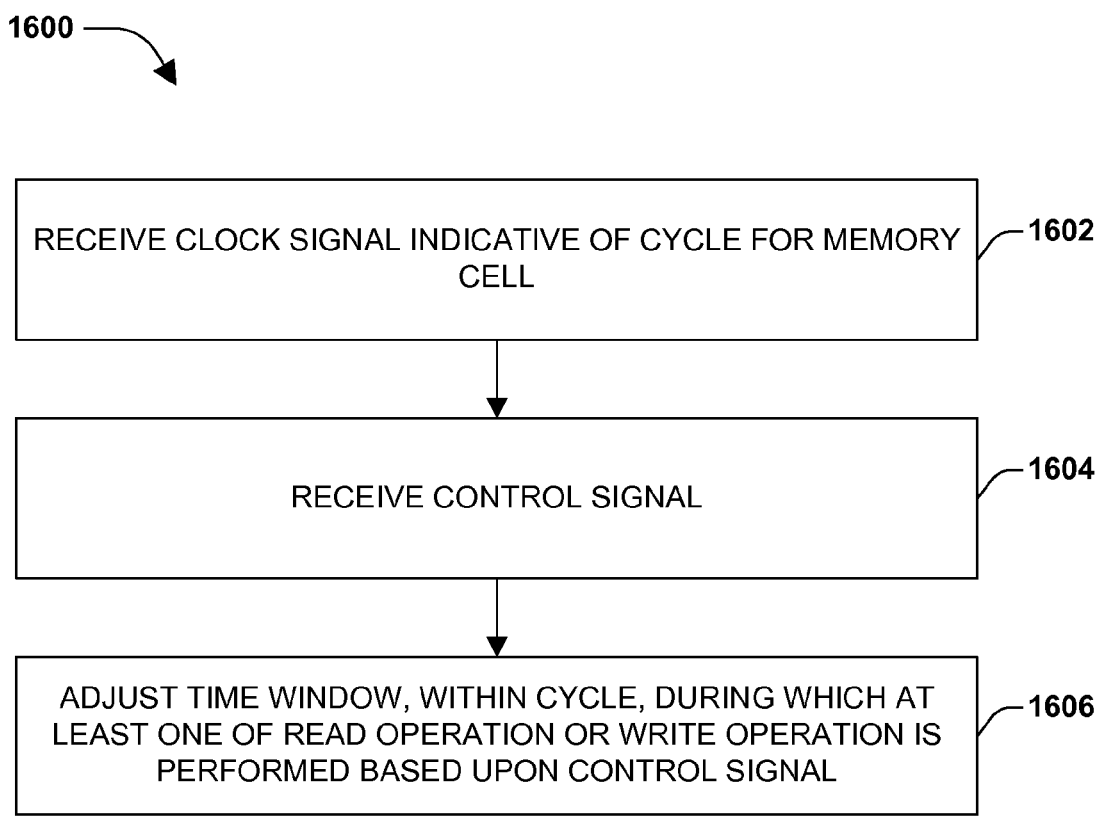
FIG. 16 illustrates a flow diagram of an example method for dynamically controlling at least one of a read operation or a write operation of a memory cell, according to some embodiments.

FIG. 16 illustrates an example method 1600 for dynamically controlling at least one of a read operation or a write operation of a memory cell. In some embodiments, the memory cell is an SRAM cell, such as a four-transistor SRAM cell or a six-transistor SRAM cell, for example. At 1602 a clock signal CLK indicative of a cycle for a memory cell is received, such as from a system clock, and at 1604 a control signal CTRL is received, such as from a processing unit. Based upon one or more properties of the control signal CTRL, a time window, within a cycle, during which at least one of a read operation or a write operation is performed is adjusted at 1606. For example, based upon one or more properties of the control signal CTRL a decision is made whether to perform a read operation during a first time window, such as early in the cycle or during a second time window, such as later in the cycle. As another example, based upon one or more properties of the control signal CTRL a decision is made whether to perform a write operation during a first time window, such as early in the cycle or during a second time window, such as later in the cycle. In some embodiments, a voltage of control signal CTRL at the start of a cycle is utilized to determine whether or when to adjust the time window. For example, in some embodiments, a change in the voltage of the control signal CTRL between a first cycle and a second cycle causes the time window during which a read operation is performed to be adjusted between the first cycle and the second cycle. In other embodiments, a change in the voltage of the control signal between a first cycle and a second cycle causes the time window during which a write operation is performed to be adjusted between a first cycle and a second cycle.

According to an aspect of the instant disclosure, control logic for a memory cell is provided. The control logic comprises timing logic configured to receive a clock signal indicative of a cycle and to adjust, within the cycle, a time window during which at least one of a read operation or a write operation is performed.

According to another aspect of the instant disclosure, a method for dynamically controlling at least one of a read operation or a write operation of a memory cell is provided. The method comprises receiving a clock signal indicative of a cycle for the memory cell and receiving a control signal. The method also comprises adjusting a time window, within the cycle, during which at least one of the read operation or the write operation is performed based upon the control signal.

According to yet another aspect of the instant disclosure, a memory arrangement is provided. The memory arrangement comprises a static random access memory cell to which a bit is at least one of read or written. The memory arrangement also comprises timing logic configured to receive a clock signal indicative of a cycle and a control signal. The control signal is used by the timing logic to adjust, within the cycle, a time window during which the bit is at least one of read or written.

Figure 17:
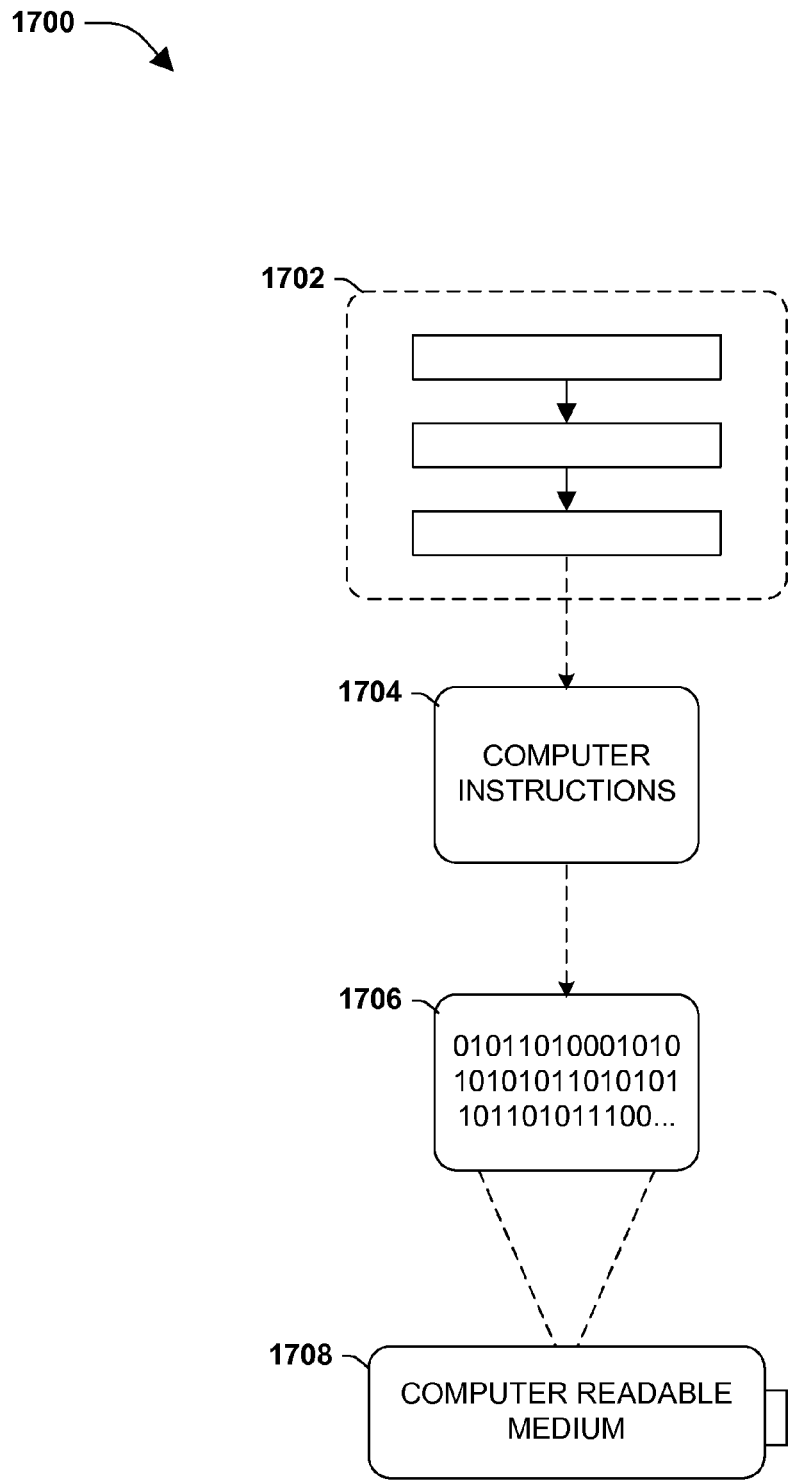
FIG. 17 is a diagram illustrating an example computer-readable medium, device, or memory comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 17, wherein an implementation 1700 comprises a computer-readable medium 1708, such as a CD-R, DVD-R, flash drive, a platter of a hard disk drive, etc., on which is encoded computer-readable data 1706. This computer-readable data 1706, such as binary data comprising a plurality of zero's and one's as shown in 1706, in turn comprises a set of process-executable computer instructions 1704 which when executed via a processing unit are configured to operate according to one or more of the principles set forth herein. In some embodiments 1700, the processor-executable computer instructions 1704 are configured to perform a method 1702, such as at least some of the exemplary method 1600 of FIG. 16. In other embodiments, the processor-executable computer instructions 1704 are configured to implement a system such as at least some of the memory arrangement 106 of FIG. 1a, at least some of the memory cell 108 of FIG. 2, or at least some of the timing logic 120 of FIG. 9. Many such computer-readable media are devised by those of ordinary skill in the art that are configured to operate in accordance with the techniques presented herein.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A control logic for a memory cell, comprising:
   timing logic configured to:
   receive a clock signal indicative of clock cycles;
   receive at least one of:
   a write enable signal specifying whether to perform write operations during respective clock cycles; or
   a read enable signal specifying whether to perform read operations during respective clock cycles;
   receive a control signal specifying a timing for performing at least one of the read operations or the write operations during the respective clock cycles; and
   adjust, between clock cycles, a start time of at least one of a read operation or a write operation based upon the control signal.

2. The control logic of claim 1, the timing logic configured to adjust the start time of the read operation from a first half of a first clock cycle of the clock cycles to a second half of a second clock cycle of the clock cycles.

3. The control logic of claim 1, the timing logic configured to adjust the start time of the write operation from a first half of a first clock cycle of the clock cycles to a second half of a second clock cycle of the clock cycles.

4. The control logic of claim 1, the timing logic configured to adjust the start time of the read operation and the write operation such that at least one of:
   during a first clock cycle of the clock cycles a read-then-write operation is performed and during a second clock cycle of the clock cycles a write-then-read operation is performed; or
   during the first clock cycle a write-then-read operation is performed and during the second clock cycle a read-then-write operation is performed.

5. The control logic of claim 1, wherein the memory cell is a static random access memory cell.

6. The control logic of claim 1, wherein the memory cell is a six-transistor static random access memory cell.

7. The control logic of claim 1, wherein the memory cell is a four-transistor static random access memory cell.

8. A method for dynamically controlling at least one of a read operation or a write operation of a memory cell, comprising:
   receiving a clock signal indicative of clock cycles for the memory cell, respective clock cycles having a period;
   receiving a control signal specifying a timing for performing at least one of read operations or write operations during the respective clock cycles;
   for a first clock cycle of the clock cycles:
   initiating a first operation during a first portion of the period based upon a state of the control signal at the first clock cycle; and
   for a second clock cycle of the clock cycles:

initiating a second operation during a second portion of the period based upon a state of the control signal at the second clock cycle, the second portion different than the first portion.

9. The method of claim 8, the first operation selected from a group consisting of:
- an early read operation;
- a late read operation;
- an early write operation;
- a late write operation;
- a read-then-write operation; and
- a write-then-read operation.

10. The method of claim 9, the second operation selected from the group consisting of:
- the early read operation;
- the late read operation;
- the early write operation;
- the late write operation;
- the read-then-write operation; and
- the write-then-read operation.

11. The method of claim 8, comprising:
   receiving a write enable signal specifying whether to perform write operations during the respective clock cycles; and
   receiving a read enable signal specifying whether to perform read operations during the respective clock cycles.

12. The method of claim 11, comprising, for the first clock cycle comprising:
   determining whether a read operation is to occur within the first clock cycle based upon the read enable signal;
   determining whether a write operation is to occur within the first clock cycle based upon the write enable signal; and
   determining a start time for at least one of the read operation or the write operation based upon the control signal.

13. A memory arrangement, comprising:
   timing logic configured to:
      receive a clock signal indicative of clock cycles;
      receive a control signal specifying a timing for performing at least one of read operations or write operations during respective clock cycles;
      receive a write enable signal specifying whether to perform the write operations during the respective clock cycles;
      receive a read enable signal specifying whether to perform the read operations during the respective clock cycles;
      identify, at a first clock cycle of the clock cycles, a first operation to be performed within the first clock cycle, based upon the control signal, the write enable signal, and the read enable signal; and
      identify, at a second clock cycle of the clock cycles, a second operation to be performed within the second clock cycle, based upon the control signal, the write enable signal, and the read enable signal, the second operation different than the first operation.

14. The memory arrangement of claim 13, comprising:
   a static random access memory cell to which a bit is at least one of read or written, the static random access memory cell comprising:
      an arrangement of 6 transistors, wherein:
         a first four of the six transistors are arranged to form a memory latch, a first output of the memory latch is coupled to a bit line via a fifth transistor of the six transistors and a second output of the memory latch is coupled to a complementary bit line via a sixth transistor of the six transistors.

15. The memory arrangement of claim 13, the timing logic configured to identify the first operation by:
   determining whether a read operation is to occur within the first clock cycle based upon the read enable signal;
   determining whether a write operation is to occur within the first clock cycle based upon the write enable signal; and
   determining a start time for at least one of the read operation or the write operation based upon the control signal.

16. The memory arrangement of claim 13, comprising:
   a static random access memory cell coupled to the timing logic.

17. The memory arrangement of claim 16, the static random access memory cell configured as a two-port register file and configured to selectively perform a single port function.

18. The memory arrangement of claim 17, the static random access memory cell configured to selectively perform a dual port function.

19. The method of claim 11, comprising:
   selecting the first operation, from a group of operations, based upon a logical state of the write enable signal, a logical state of the read enable signal, and a logical state of the control signal at a start of the first clock cycle.

20. The method of claim 19, the group of operations comprising an early read operation; a late read operation; an early write operation; a late write operation; a read-then-write operation; and a write-then-read operation.

* * * * *